(12) United States Patent
Kizu et al.

(10) Patent No.: US 12,293,505 B2
(45) Date of Patent: May 6, 2025

(54) EVALUATION APPARATUS, COMPUTER-READABLE STORAGE MEDIUM, EVALUATION METHOD, FORMING SYSTEM, AND ARTICLE MANUFACTURING METHOD

(71) Applicant: CANON KABUSHIKI KAISHA, Tokyo (JP)

(72) Inventors: Fuma Kizu, Tochigi (JP); Koji Ishibashi, Tokyo (JP); Sentaro Aihara, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 538 days.

(21) Appl. No.: 17/703,460

(22) Filed: Mar. 24, 2022

(65) Prior Publication Data
US 2022/0309647 A1 Sep. 29, 2022

(30) Foreign Application Priority Data
Mar. 29, 2021 (JP) .................. 2021-055838

(51) Int. Cl.
*G06T 7/00* (2017.01)
*G03F 7/00* (2006.01)
(Continued)

(52) U.S. Cl.
CPC .......... *G06T 7/0004* (2013.01); *G03F 7/0002* (2013.01); *G03F 7/7065* (2013.01);
(Continued)

(58) Field of Classification Search
CPC ......... G06T 7/0004; G06T 2207/20081; G06T 2207/30148; G06N 20/00; G03F 7/0002; G03F 7/7065; G03F 9/7042
See application file for complete search history.

(56) References Cited

U.S. PATENT DOCUMENTS 8,349,241 B2 * 1/2013 Sreenivasan .......... B82Y 10/00
264/319
11,164,302 B2 11/2021 Bean
(Continued)

FOREIGN PATENT DOCUMENTS

| JP | 2019080047 A | 5/2019 |
|----|--------------|--------|
| JP | 2020145383 A | 9/2020 |

(Continued)

*Primary Examiner* — Shefali D Goradia
(74) *Attorney, Agent, or Firm* — ROSSI, KIMMS & McDOWELL LLP

(57) ABSTRACT

An evaluation apparatus that evaluates a composition formed on a substrate by forming processing is provided. The apparatus comprises an obtaining device that obtains an image including the composition by the forming processing, and a processing device that processes the image for the evaluation. The processing device outputs a feature of each of one or more abnormalities in the image according to an inference model, obtains information regarding a formation region on the substrate where the composition has been formed, determines the kind of each of the abnormalities based on the output feature of each of the abnormalities and a relationship between the information and a position and a size of the abnormality, and makes, based on a result of the determination, final determination as to whether the image is a normal image or an image including an abnormality.

15 Claims, 15 Drawing Sheets

(51) Int. Cl.
*G03F 9/00* (2006.01)
*G06N 20/00* (2019.01)

(52) U.S. Cl.
CPC ........... *G03F 9/7042* (2013.01); *G06N 20/00* (2019.01); *G06T 2207/20081* (2013.01); *G06T 2207/30148* (2013.01)

(56) References Cited

U.S. PATENT DOCUMENTS

| | | | |
|---|---|---|---|
| 2012/0261849 A1* | 10/2012 | Hashimoto | G03F 7/0002 |
| | | | 425/169 |
| 2016/0052179 A1* | 2/2016 | Murayama | G03F 7/0002 |
| | | | 264/40.5 |
| 2018/0107928 A1 | 4/2018 | Zhang et al. | |
| 2019/0061207 A1* | 2/2019 | Terao | B29C 43/34 |
| 2020/0201190 A1 | 6/2020 | Bean et al. | |
| 2020/0282630 A1 | 9/2020 | Koura et al. | |
| 2021/0256325 A1 | 8/2021 | Yang et al. | |
| 2022/0285227 A1* | 9/2022 | Benvegnu | G06T 7/001 |

FOREIGN PATENT DOCUMENTS

| | | |
|---|---|---|
| JP | 2021027349 A | 2/2021 |
| KR | 1020190072569 A | 6/2019 |
| WO | 2020095909 A1 | 5/2020 |

* cited by examiner

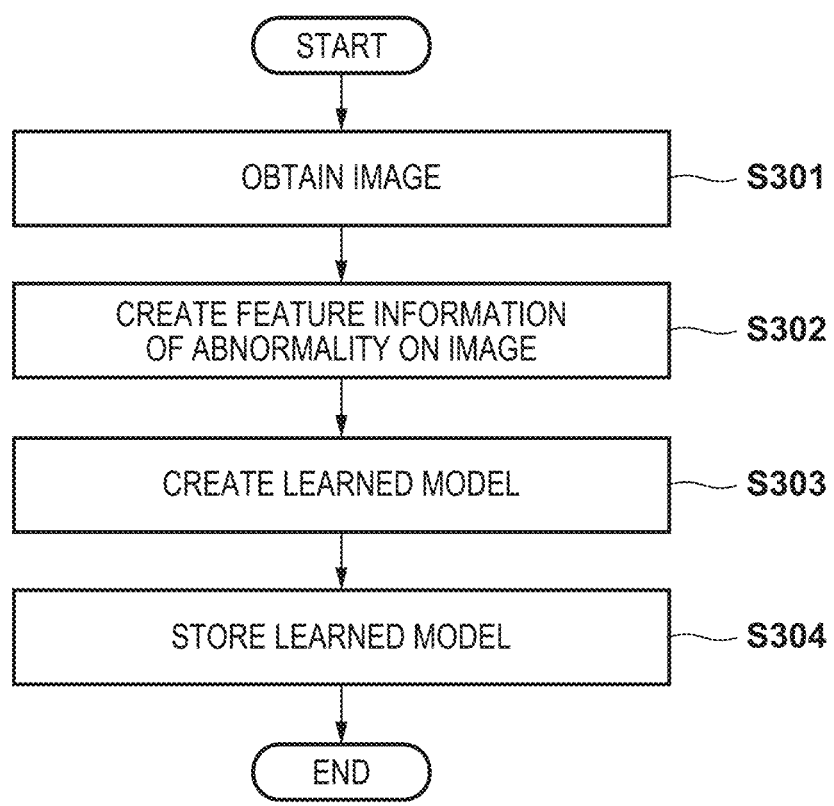

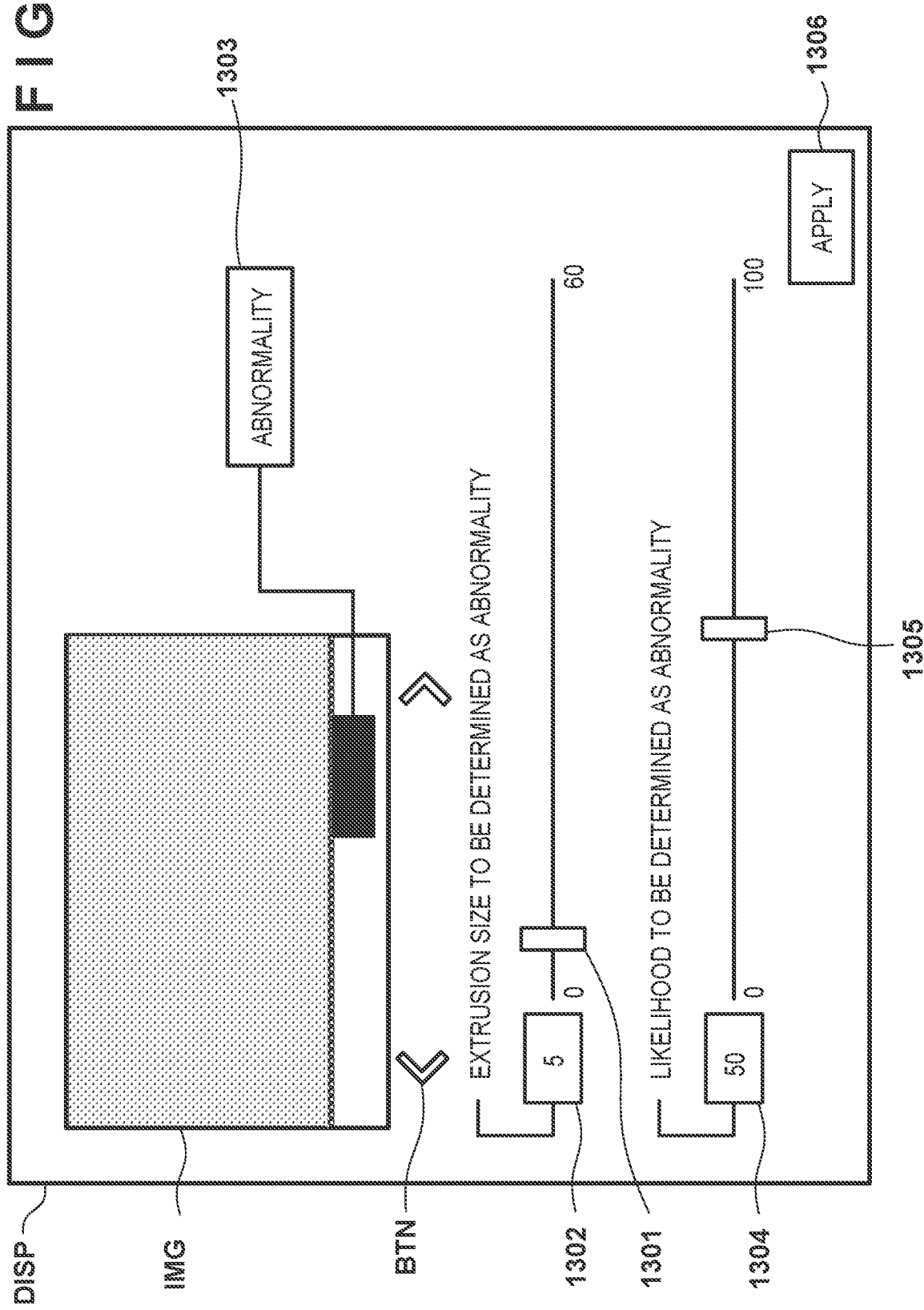

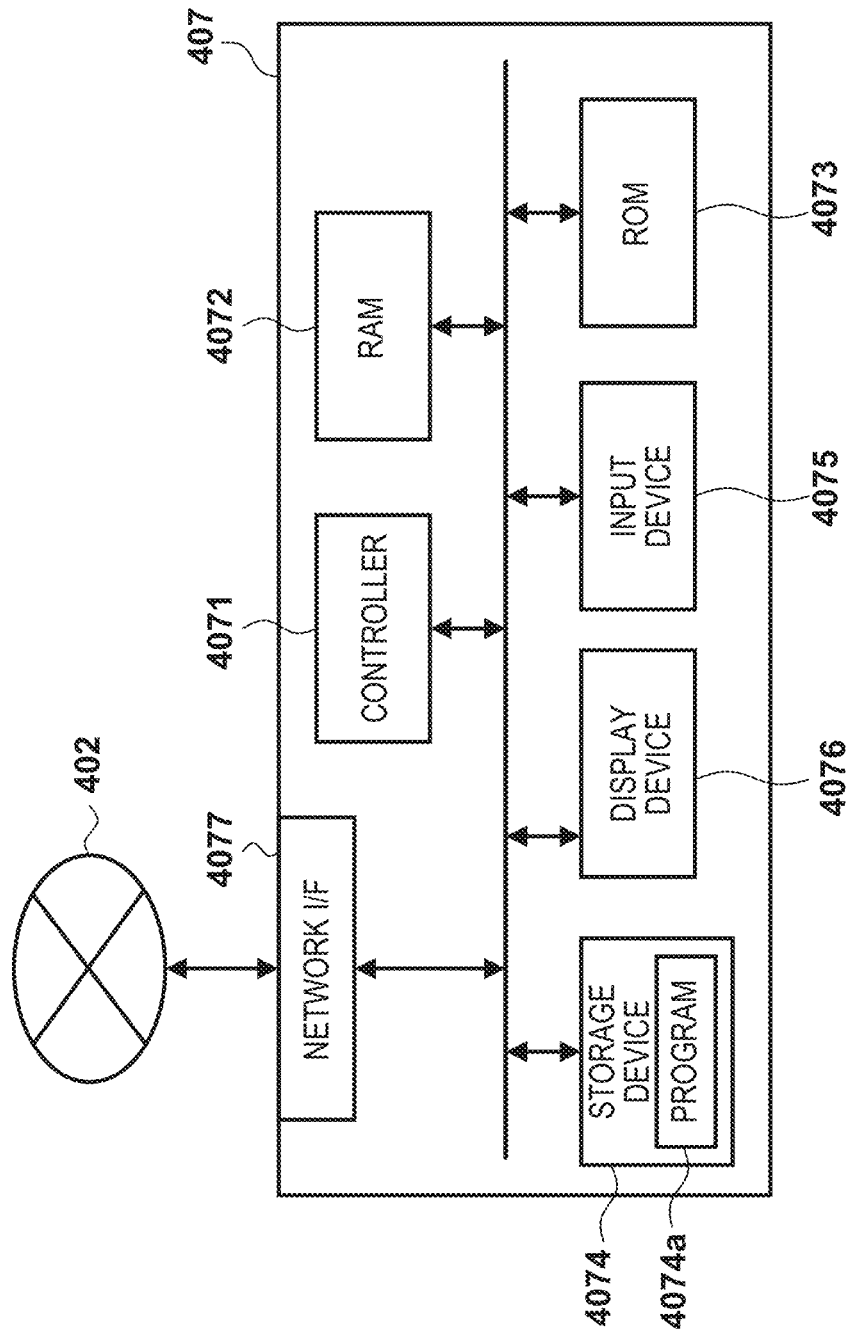

EVALUATION APPARATUS, COMPUTER-READABLE STORAGE MEDIUM, EVALUATION METHOD, FORMING SYSTEM, AND ARTICLE MANUFACTURING METHOD

BACKGROUND OF THE INVENTION

Field of the Invention

The present invention relates to an evaluation apparatus, a computer-readable storage medium, an evaluation method, a forming system, and an article manufacturing method.

Description of the Related Art

As a technique capable of producing a microstructured device according to a design rule on the nanometer order and suitable for mass production, an imprint technique is being put into practical use. The imprint technique is a technique in which a mold (to be also referred to as a template) including a pattern having a nanometer-scale structure formed using an electron beam drawing apparatus, an exposure apparatus, or the like is brought into contact with a formable material (imprint material) on a substrate to transfer the pattern. A photo-curing method is one example of the imprint technique. An imprint apparatus employing the photo-curing method forms, using a mold, a photo-curable imprint material supplied in a shot region on a substrate, cures the imprint material by light irradiation, and separates the mold from the cured imprint material, thereby forming a pattern on the substrate.

Upon forming a pattern on a substrate using the imprint technique, extrusion may occur in which an imprint material protrudes to the outside of a shot region (see, for example, Japanese Patent Laid-Open No. 2019-080047). To the contrary, unfilling may occur in which the imprint material does not spread and the pattern cannot be partially formed. If extrusion occurs, the portion where the imprint material protrudes becomes defective. In addition, when forming a pattern in the shot region into which the imprint material protrudes, the protruded imprint material may come in contact with a mold and break a pattern of the mold. On the other hand, if unfilling occurs, a pattern is partially not formed on a shot region, so the product may become defective as a semiconductor device.

Accordingly, it is necessary to observe (check) the presence/absence of extrusion and unfilling after the imprint process, and adjust the amount and position of an imprint material to be supplied on a substrate, thereby suppressing the occurrence of extrusion and unfilling. Since, however, a portion where extrusion or unfilling occurs is a very small region, the observation range is narrow, so it is necessary to check a huge number of observation images obtained by a high-powered microscope, but it is unrealistic to check a huge number of observation images by manpower. Therefore, demands have arisen for a technique that inspects extrusion and unfilling from observation images and determines an abnormality (formation defect) of the pattern caused by extrusion or unfilling without manpower.

A formation defect of the pattern has features including various kinds and sizes, and the influence on the process and the countermeasure change in accordance with the features of the formation defect. Therefore, it is necessary to distinguish the features. Further, the processing with respect to the formation defect may be changed in accordance with information other than image information, such as the location where the image was captured.

SUMMARY OF THE INVENTION

The present invention provides a technique advantageous in detecting an abnormality of a composition on a substrate obtained by forming processing and checking the kind of the abnormality with high efficiency.

The present invention in its one aspect provides an evaluation apparatus that evaluates a composition formed on a substrate by forming processing, wherein the forming processing is processing of forming the composition made of a cured product of a formable material on the substrate by curing the formable material in a state in which the formable material on the substrate is in contact with a mold, the apparatus comprises an obtaining device configured to obtain an image including the composition formed on the substrate by the forming processing, and a processing device configured to process the obtained image for the evaluation, and the processing device is configured to output a feature of each of one or more abnormalities in the obtained image according to an inference model, obtain information regarding a formation region on the substrate where the composition has been formed, determine the kind of each of the abnormalities based on the output feature of each of the abnormalities and a relationship between the information regarding the formation region and a position and a size of the abnormality, and make, based on a result of the determination, final determination as to whether the image is a normal image or an image including an abnormality.

Further features of the present invention will become apparent from the following description of exemplary embodiments (with reference to the attached drawings).

BRIEF DESCRIPTION OF THE DRAWINGS

FIG. 9 is a flowchart of a learned model creation method;

FIG. 13 is a view showing an example of a setting device;

FIG. 14 is a view showing the arrangement of an evaluation apparatus; and

DESCRIPTION OF THE EMBODIMENTS

Figure 1A:
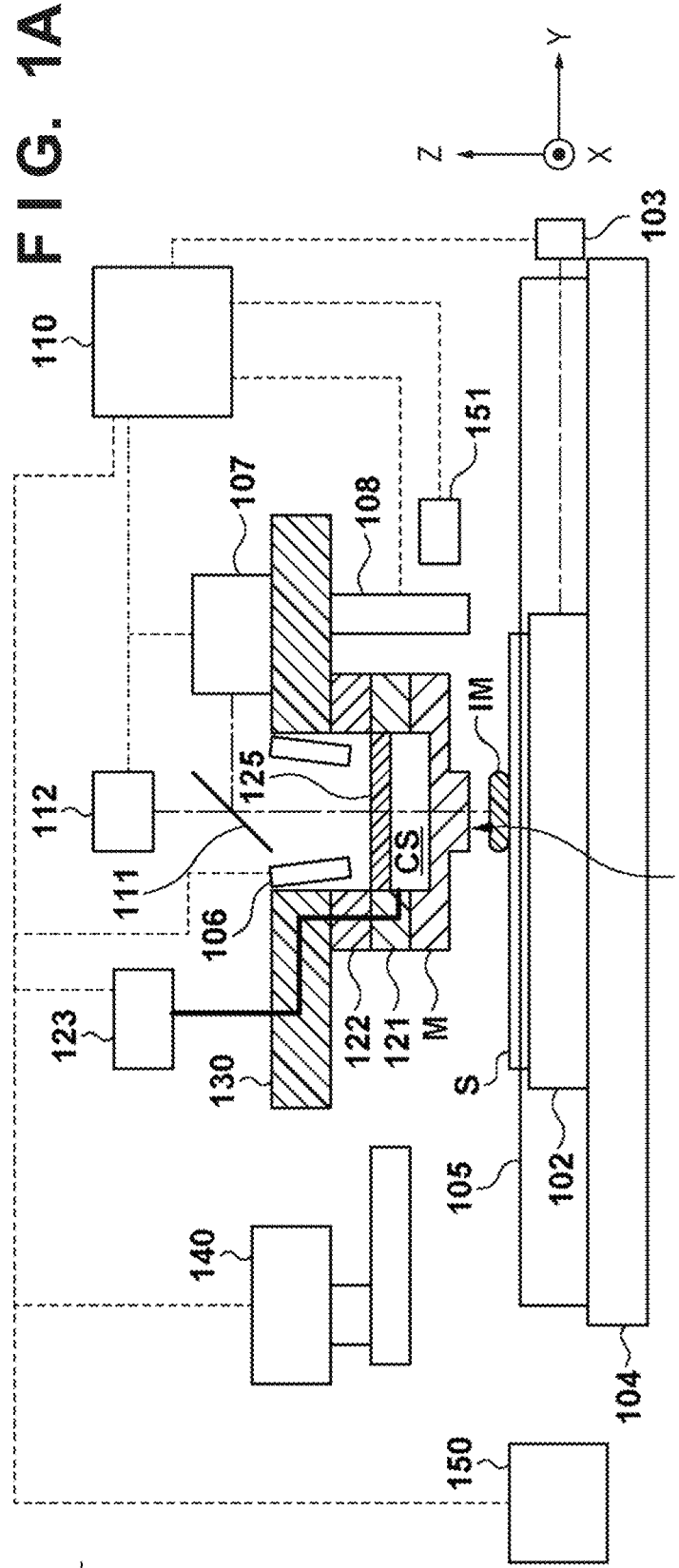
FIGS. 1A and 1B are views showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

An embodiment described below is related to a forming system including a forming apparatus that performs forming processing of forming a formable material (curable composition) on a substrate. The forming processing includes a contact step of bringing the formable material supplied onto the substrate into contact with a mold (original or template). With this contact, the formable material is formed. The forming processing can further include a curing step of curing the formable material in a state in which the formable material and the mold are in contact with each other. With this step, a composition made of a cured product of the formable material is formed on the substrate. The forming processing can further include a separation step of separating the composition made of the cured product of the formable material from the mold.

The forming apparatus can be used as an imprint apparatus that transfers a pattern of a mold to an imprint material by bringing the imprint material as a formable material supplied onto a shot region on a substrate where the pattern is to be formed into contact with a pattern portion of the mold. The pattern can be, for example, a pattern (device pattern) of a semiconductor device. In the imprint apparatus, the imprint process can be performed for each of a plurality of shot regions formed on a substrate. Alternatively, it is also possible to configure the imprint apparatus to perform the imprint process (that is, contact) collectively for multiple shot regions (for the entire surface of the substrate or for the shot regions in one, two, or more rows) of the substrate.

Alternatively, the forming apparatus can be used as a planarizing apparatus that brings a formable material on a substrate into contact with a member including a flat surface (a flat surface of a mold), thereby forming a planarized film made of the formable material.

Hereinafter, in order to show a specific example, a system including the imprint apparatus as one example of the forming apparatus will be described.

FIG. 1A schematically shows the arrangement of an imprint apparatus IMP according to an embodiment. The imprint apparatus IMP performs an imprint process in which an imprint material IM is cured in a state in which the imprint material IM on a substrate S is in contact with a pattern region MP of a mold M, and the mold M is separated from a cured product of the imprint material IM. With the imprint process, a pattern made of a cured product of the imprint material IM is formed on the substrate S.

As an imprint material, a curable composition (to be also referred to as a resin in an uncured-state) that is cured by receiving curing energy is used. Examples of the curing energy can be an electromagnetic wave, heat, and the like. The electromagnetic wave can be light selected from the wavelength range of 10 nm (inclusive) to 1 mm (inclusive), for example, infrared light, a visible light beam, ultraviolet light, or the like. The curable composition can be a composition cured with light irradiation or heating. A photo-curable composition cured by light irradiation contains at least a polymerizable compound and a photopolymerization initiator, and may further contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film obtained by connecting a plurality of droplets. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass.

In the specification and the accompanying drawings, directions will be indicated on an XYZ coordinate system in which a horizontal surface is defined as the X-Y plane. In general, the substrate S is placed on a substrate holder 102 such that the surface of the substrate S is parallel to the horizontal surface (X-Y plane). Therefore, in the following description, the directions orthogonal to each other in a plane along the surface of the substrate S are the X-axis and the Y-axis, and the direction perpendicular to the X-axis and the Y-axis is the Z-axis. Further, in the following description, directions parallel to the X-axis, the Y-axis, and the Z-axis of the XYZ coordinate system are referred to as the X direction, the Y direction, and the Z direction, respectively. A rotation about the X-axis, a rotation about the Y-axis, and a rotation about the Z-axis are indicated by θX, θY, θZ, respectively. Positioning means controlling the position and/or the posture. Alignment can include controlling the position and/or the posture of at least one of a substrate and a mold.

The imprint apparatus IMP can include the substrate holder 102 that holds the substrate S, a substrate driving mechanism 105 that drives the substrate S by driving the substrate holder 102, a base 104 that supports the substrate holder 102, and a position measurement device 103 that measures the position of the substrate holder 102. The substrate driving mechanism 105 can include, for example, a motor such as a linear motor.

The imprint apparatus IMP can include a mold holder 121 that holds the mold M, a mold driving mechanism 122 that drives the mold M by driving the mold holder 121, and a support structure 130 that supports the mold driving mechanism 122. The mold driving mechanism 122 can include, for example, a motor such as a voice coil motor.

The substrate driving mechanism 105 and the mold driving mechanism 122 form a driving mechanism for adjusting a relative position and a relative posture between the substrate S and the mold M. The adjustment of the relative position between the substrate S and the mold M by the driving mechanism includes a driving operation to bring the mold into contact with the imprint material on the substrate S and a driving operation to separate the mold from the cured imprint material (a pattern made of the cured product). The substrate driving mechanism 105 can be a driving mechanism having a plurality of degrees of freedom (for example, three axes including the X-axis, Y-axis, and θZ-axis, and preferably six axes including the X-axis, Y-axis, Z-axis, θX-axis, θY-axis, and θZ-axis). The mold driving mechanism 122 can also be a driving mechanism having a plurality of degrees of freedom (for example, three axes including the Z-axis, θX-axis, and θY-axis, and preferably six axes including the X-axis, Y-axis, Z-axis, θX-axis, θY-axis, and θZ-axis).

The imprint apparatus IMP can include a mold conveyance mechanism 140 that conveys the mold M, and a mold cleaner 150. The mold conveyance mechanism 140 can be configured to, for example, convey the mold M to the mold holder 121 and convey the mold M from the mold holder 121 to an original stocker (not shown), the mold cleaner 150, or the like. The mold cleaner 150 cleans the mold M by using ultraviolet light, a chemical solution, or the like.

Figure 1B:
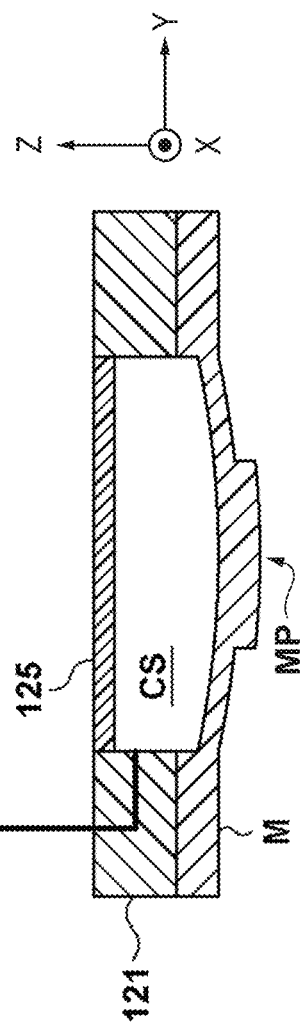

The mold holder 121 can include a window member 125 that forms a pressure-controlled space CS on the side of a reverse surface (a surface on a side opposite to the pattern region MP on which the pattern to be transferred to the substrate S has been formed) of the mold M. The imprint apparatus IMP can include a deformation mechanism 123 that controls the pressure (to be referred to as a cavity pressure hereinafter) of the pressure-controlled space CS to deform the pattern region MP of the mold M into a convex shape toward the substrate S as schematically shown in FIG. 1B.

The imprint apparatus IMP can include an alignment measurement device 106, a wide-angle alignment measurement device 151, a curing device 107, an imaging device 112, and an optical member 111. The alignment measurement device 106 illuminates an alignment mark of the substrate S and an alignment mark of the mold M and captures the images of the marks, thereby measuring the relative position between the marks. The alignment measurement device 106 can be positioned by a driving mechanism (not shown) in accordance with the positions of the alignment marks to be observed. The wide-angle alignment measurement device 151 is a measurement device having a field wider than that of the alignment measurement device 106. The wide-angle alignment measurement device 151 illuminates an alignment mark of the substrate S and captures the image of the alignment mark, thereby measuring the position of the substrate S. By measuring the position of the substrate S by the wide-angle alignment measurement device, it is possible to move the alignment mark of the substrate S into the field of the alignment measurement device 106.

The curing device 107 irradiates the imprint material IM with an energy (for example, light such as ultraviolet light) for curing the imprint material IM via the optical member 111, and cures the imprint material IM with this energy. The imaging device 112 captures images of the substrate S, the mold M, and the imprint material IM via the optical member 111 and the window member 125.

Figure 2:
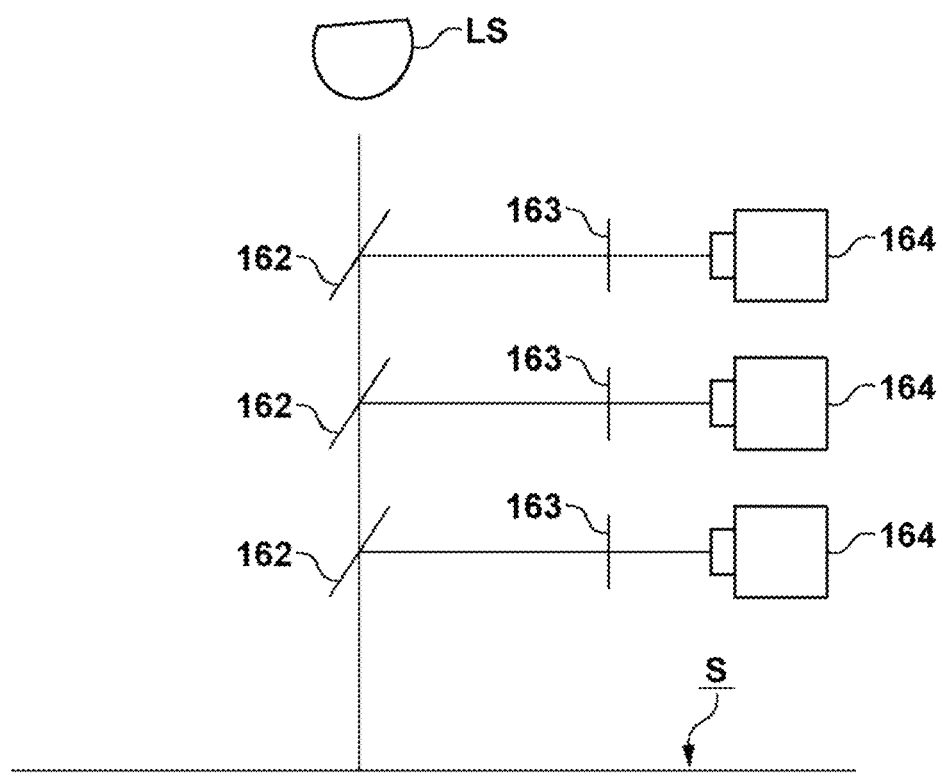
FIG. 2 is a view showing the arrangement of a wide-angle alignment measurement device.

The wide-angle alignment measurement device 151 may include a mechanism for switching the wavelength of illumination light. For example, the wide-angle alignment measurement device 151 includes a wavelength filter arranged on an optical path, and a mechanism for switching the wavelength filter. Alternatively, as shown in FIG. 2, the wide-angle alignment measurement device 151 may have an arrangement enabling simultaneous capturing of images of a plurality of wavelengths. The wide-angle alignment measurement device 151 shown in FIG. 2 includes a light source LS, a plurality of half mirrors 162 each branching off from the optical path, a plurality of wavelength filters 163 that transmit different wavelengths, and a plurality of imaging elements 164 so that it can simultaneously capture images of different wavelengths. Further, the wide-angle alignment measurement device 151 may include a mechanism for switching the light amount of illumination light. For example, an ND filter is arranged on the optical path, and the wide-angle alignment measurement device 151 also includes a mechanism for switching the ND filter. The wide-angle alignment measurement device 151 may further include a plurality of optical systems such as a bright-field optical system and a dark-field optical system, and a mechanism for switching the optical system through which the image to be captured passes. The wide-angle alignment measurement device 151 may also include a mechanism for switching polarization of illumination light or received light. For example, the wide-angle alignment measurement device 151 can include a polarizing filter and a mechanism for switching the polarizing filter.

The imprint apparatus IMP can include a dispenser 108 for arranging the imprint material IM on the substrate S. For example, the dispenser 108 discharges the imprint material IM such that the imprint material IM is arranged on the substrate S in accordance with a drop recipe indicating the arrangement of the imprint material IM. The imprint apparatus IMP can include a controller 110 that controls the substrate driving mechanism 105, the mold driving mechanism 122, the deformation mechanism 123, the mold conveyance mechanism 140, the mold cleaner 150, the alignment measurement device 106, the curing device 107, the imaging device 112, the dispenser 108, and the like. The controller 110 can be formed by, for example, a PLD (Programmable Logic Device) such as an FPGA (Field Programmable Gate Array), an ASIC (Application Specific Integrated Circuit), a general-purpose computer installed with a program, or a combination of all or some of these components.

Figure 3:
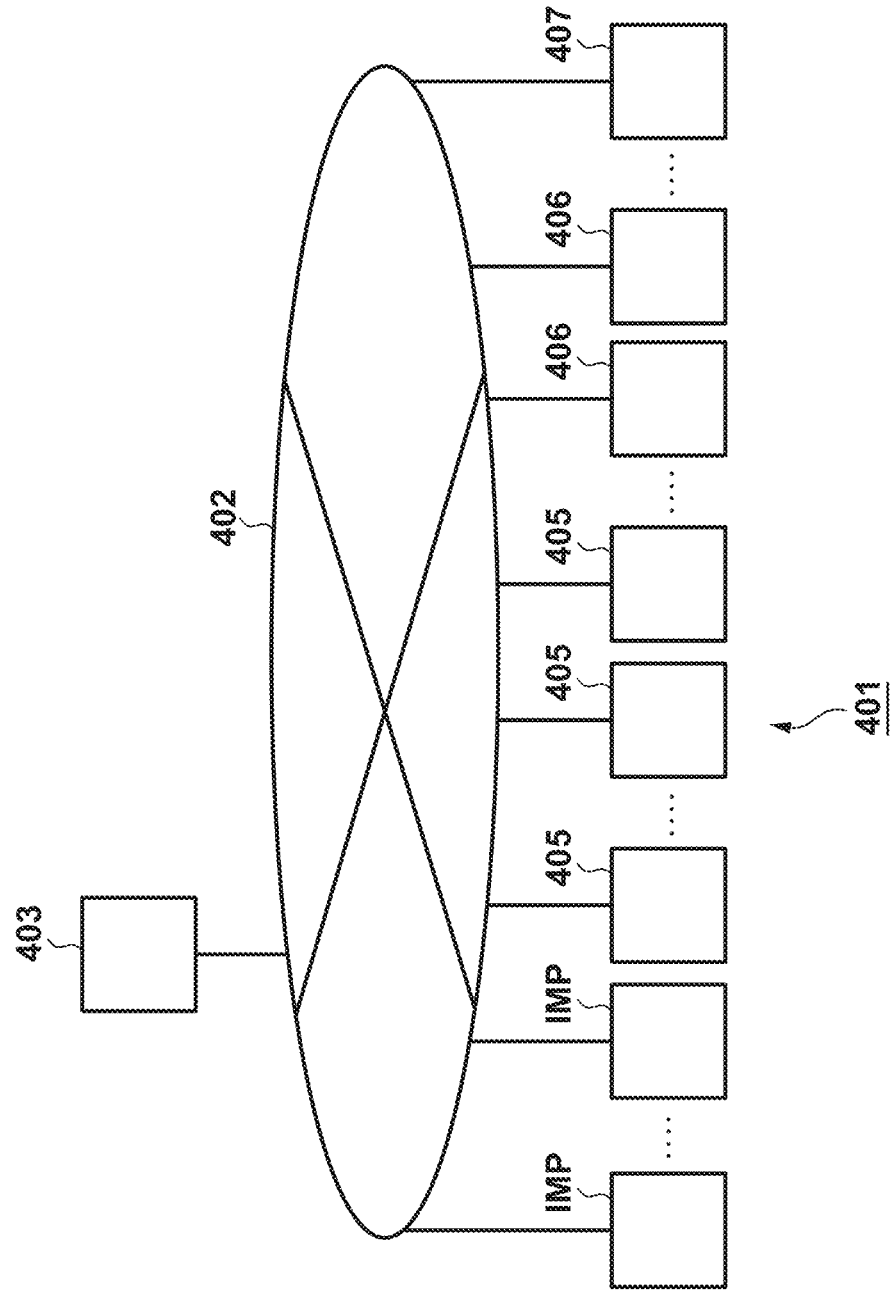
FIG. 3 is a view showing the configuration of an article manufacturing system.

FIG. 3 exemplarily shows the arrangement of an article manufacturing system 401 for manufacturing an article such as a semiconductor device. The article manufacturing system 401 can include, for example, one or a plurality of the imprint apparatuses IMP and one or a plurality of inspection apparatuses 405 (for example, an overlay inspection apparatus and/or a CD inspection apparatus and/or a defect inspection apparatus and/or an electrical characteristics inspection apparatus). The article manufacturing system 401 can also include one or a plurality of substrate processing apparatuses 406 (an etching apparatus and/or a deposition apparatus). The article manufacturing system 401 can further include an evaluation apparatus 407 to be described later. These apparatuses can be connected to a control server 403, which is an external apparatus different from the imprint apparatus IMP, via a network 402 and controlled by the control server 403.

The evaluation apparatus 407 is formed by an information processing apparatus, and the information processing apparatus can be formed by, for example, a PLD (Programmable Logic Device) such as an FPGA (Field Programmable Gate Array), an ASIC (Application Specific Integrated Circuit), a general-purpose computer installed with a program, or a combination of all or some of these components.

FIG. 14 shows an arrangement example of the evaluation apparatus 407. The evaluation apparatus 407 can include a controller 4071, a RAM 4072 that stores temporal data and provides a work area to the controller 4071, and a ROM 4073 storing permanent data and programs. The evaluation apparatus 407 can further include a storage device 4074, a display device 4076, and an input device 4075. The storage device 4074 stores a program 4074a for executing an evaluation method according to this embodiment. A network I/F 4077 is an interface for connection with the network 402. In this embodiment, the network I/F 4077 can function as an obtaining device for obtaining an image including a composition formed on a substrate by forming processing. Further, the controller 4071 can function as a processing device for processing the obtained image for evaluation. The controller 4071 can also function as a display controller for controlling display of the display device 4076.

Note that the evaluation apparatus 407 may be implemented using the controller 110 of the imprint apparatus IMP, the control server 403, the inspection apparatus 405, or the like, (or a combination thereof). A system including the imprint apparatus IMP and the evaluation apparatus 407 may be understood as a forming system or a lithography system.

A lithography method according to this embodiment will be described below. In this embodiment, after performing the imprint process, an image including the shot region, which is the region where the pattern is to be formed, and its vicinity is obtained by image capturing. Extrusion and unfilling are detected using the obtained image. Machine learning is used to detect extrusion and unfilling. In the machine learning, abnormality detection can be implemented using an object detection algorithm.

Figure 4:
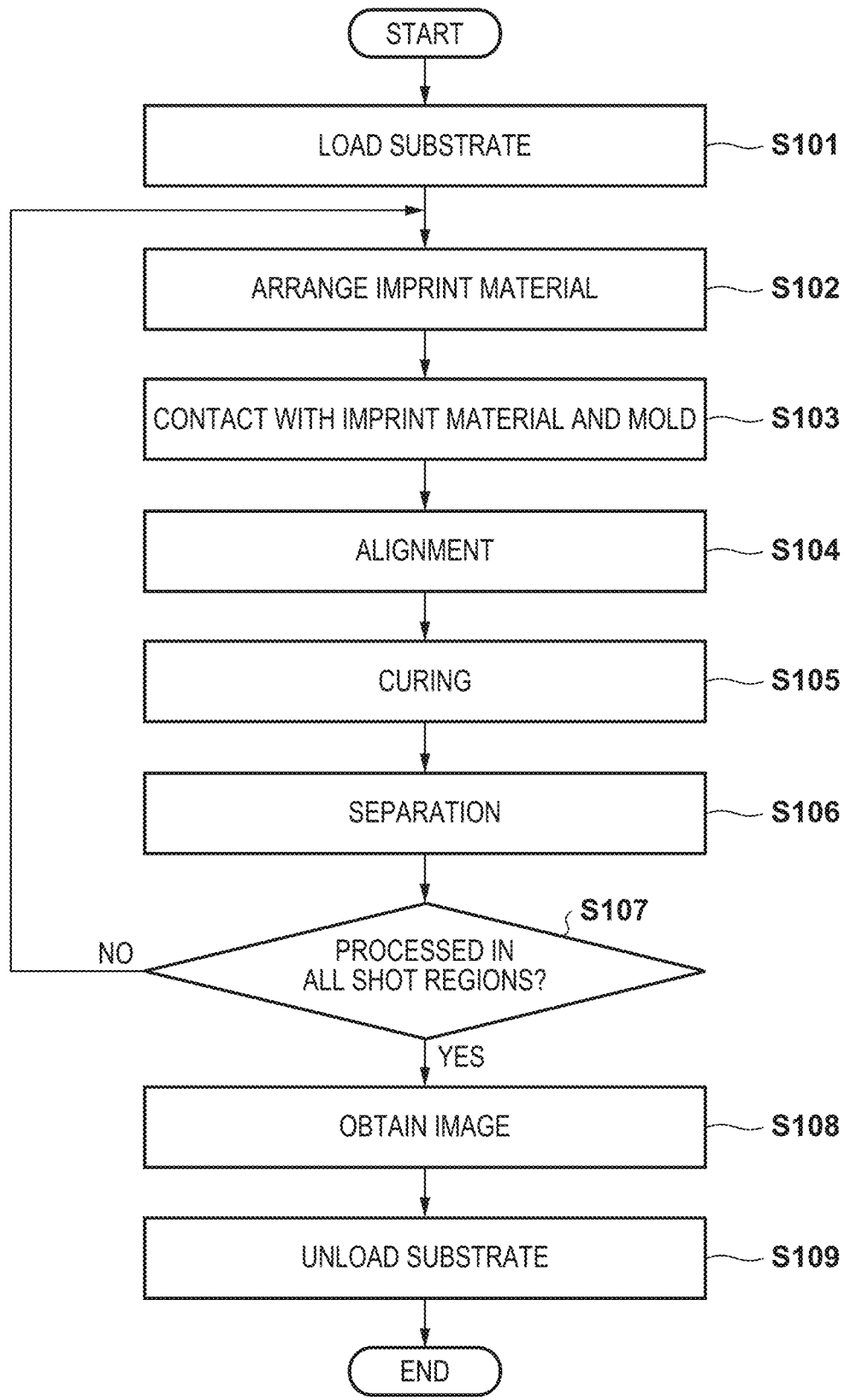
FIG. 4 is a flowchart of a lithography method performed by an imprint apparatus.

FIG. 4 illustrates a lithography method executed in the imprint apparatus IMP. Operations shown in FIG. 4 can be controlled by the controller 110.

In step S101, the substrate S is conveyed, by a substrate conveyance mechanism (not shown), from a conveyance source (for example, a relay portion between a preprocessing apparatus and the imprint apparatus IMP) onto the substrate holder 102. The position of the conveyed substrate S on the substrate holder 102 is measured by observing the mark on the substrate S by the wide-angle alignment measurement device 151. The controller 110 positions the substrate S based on the position obtained by the measurement.

In steps S102 to S106, an imprint process (pattern formation) is performed on a shot region selected from a plurality of shot regions (imprint regions) of the substrate S.

In step S102, the imprint material IM is arranged on the selected shot region by the dispenser 108. This processing can be performed by discharging the imprint material IM from the dispenser 108 while driving the substrate S by the substrate driving mechanism 105.

In step S103, the substrate S and the mold M are driven relatively by at least one of the mold driving mechanism 122 and the substrate driving mechanism 105 such that the pattern region MP of the mold M is brought into contact with the imprint material IM on the shot region. In one example, the mold M is driven by the mold driving mechanism 122 such that the pattern region MP of the mold M is brought into contact with the imprint material IM on the shot region. In the processing of bringing the pattern region MP of the mold M into contact with the imprint material IM, the pattern region MP of the mold M can be deformed into a convex shape toward the substrate S by the deformation mechanism 123. In the processing of bringing the pattern region MP of the mold M into contact with the imprint material IM, image capturing by the imaging device 112 is performed, and the captured image (spread image) can be accumulated.

In step S104, alignment between the shot region of the substrate S and the pattern region MP of the mold M can be performed. The alignment can be performed, while measuring the relative position between the alignment mark of the shot region and the alignment mark of the mold M by the alignment measurement device 106, so as to make the relative position fall within an allowable range of a target relative position. In the alignment, the substrate S and the mold M can be driven relatively by at least one of the mold driving mechanism 122 and the substrate driving mechanism 105. The target relative position between the alignment mark of the shot region and the alignment mark of the mold M can be decided based on a correction value determined from a past result of the overlay inspection apparatus or the like.

In step S105, the curing device 107 applies the energy for curing the imprint material IM to the imprint material IM between the substrate S and the pattern region MP of the mold M. With this, the imprint material IM is cured, and a cured product of the imprint material IM is formed.

In step S106, the substrate S and the mold M are driven relatively by at least one of the mold driving mechanism 122 and the substrate driving mechanism 105 so as to separate the cured product of the imprint material IM from the pattern region MP of the mold M. In one example, the mold M is driven by the mold driving mechanism 122 so as to separate the cured product of the imprint material IM from the pattern region MP of the mold M. Also when separating the cured product of the imprint material IM from the pattern region MP of the mold M, the pattern region MP of the mold M can be deformed into a convex shape toward the substrate S. Further, image capturing by the imaging device 112 is performed, and the separation state between the imprint material IM and the mold M is observed based on the captured image.

In step S107, the controller 110 determines whether the imprint process in steps S102 to S106 has been performed for all the shot regions of the substrate S. If the imprint process in steps S102 to S106 has been performed for all the shot regions of the substrate S, the controller 110 advances to step S108. If there is any unprocessed shot region, the process returns to step S102. In this case, the imprint process in steps S102 to S106 is performed on the shot region selected from the unprocessed shot regions.

In step S108, an image including the shot region after the imprint process is obtained. For example, the controller 110 uses the wide-angle alignment measurement device 151 to capture an image including the shot region and its vicinity. If the field of the wide-angle alignment measurement device 151 is small for the shot region, a plurality of images may be captured to capture the desired region while changing the position of the substrate S by driving the substrate driving mechanism 105. The image captured in step S108 can be used as an image for learning to be described later. The image captured in step S108 can be also used as an image for abnormality detection. Here, an example is described in which the wide-angle alignment measurement device 151 captures the image, but the present invention is not limited to this. For example, the alignment measurement device 106, the imaging device 112, or the like may be used to capture the image.

In the procedure described above, step S108 is performed after the imprint process has been performed for all of the plurality of shot regions, but the present invention is not limited to this. For example, the image of the pattern after the imprint process may be captured for each shot region after the pattern is formed in the shot region (after step S106). Further, as will be described later, an apparatus other than the imprint apparatus may capture, in a method similar to step S108, the image of the pattern of the substrate unloaded from the imprint apparatus.

In step S109, the substrate S is conveyed from the substrate holder 102 to a conveyance destination (for example, a relay portion between the imprint apparatus IMP and a post-processing apparatus) by a substrate conveyance mechanism (not shown). When processing a lot formed by a plurality of substrates, the operations shown in FIG. 4 are performed for each of the plurality of substrates.

Figure 5A:
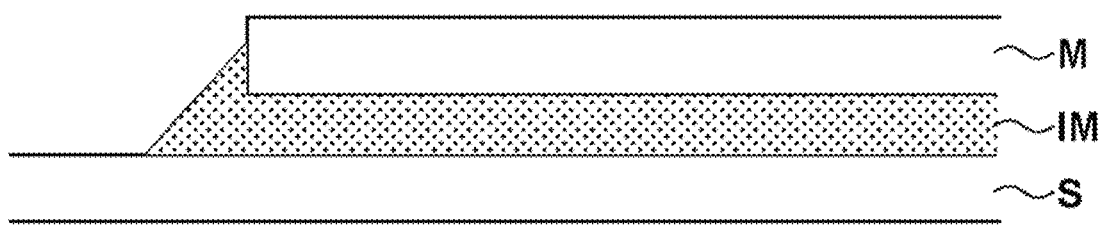
FIGS. 5A and 5B are views exemplarily showing extrusion and unfilling, respectively.
Figure 5B:
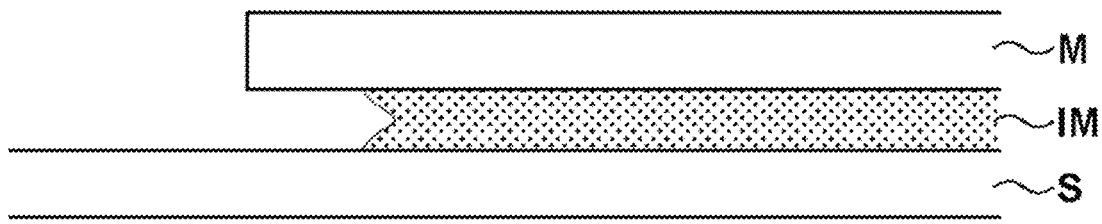

Next, an abnormality in the imprint result will be described. Each of FIGS. 5A and 5B is a side view showing a state in which the mold M and the imprint material IM on the substrate S are in contact with each other (after step S103 is completed, for example, in steps S104 and S105). Extrusion means a state in which the imprint material IM protrudes from the contact region between the mold M and the imprint material IM as shown in FIG. 5A. Unfilling means a state in which a portion where the imprint material IM is not filled between the mold M and the substrate S is generated as shown in FIG. 5B.

Figure 6A:
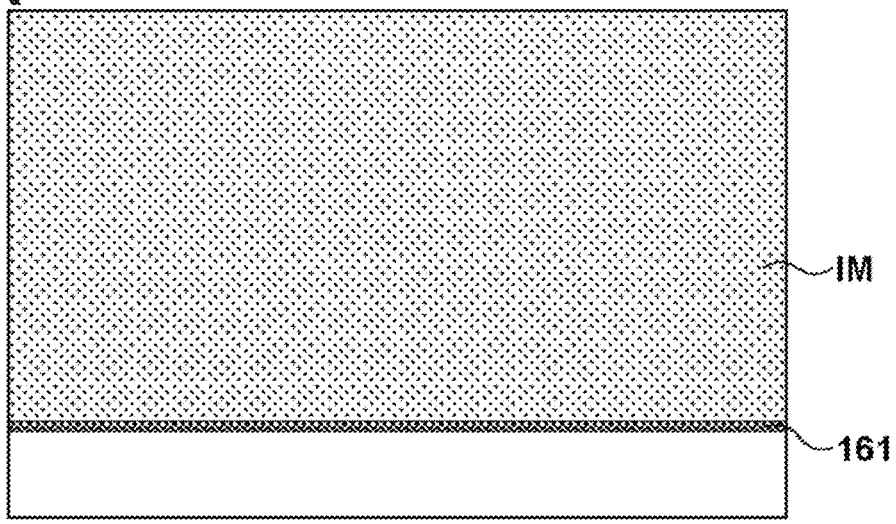
FIGS. 6A to 6C are views exemplarily showing images including extrusion and unfilling.
Figure 6B:
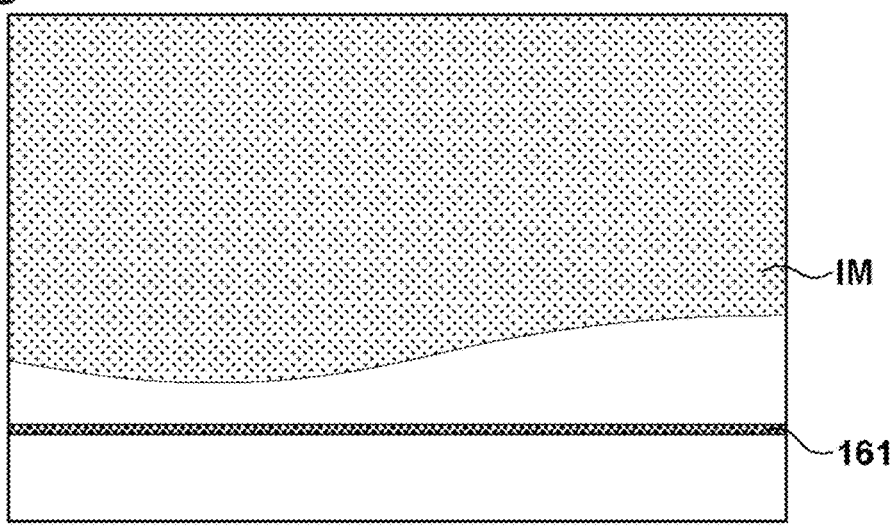
Figure 6C:
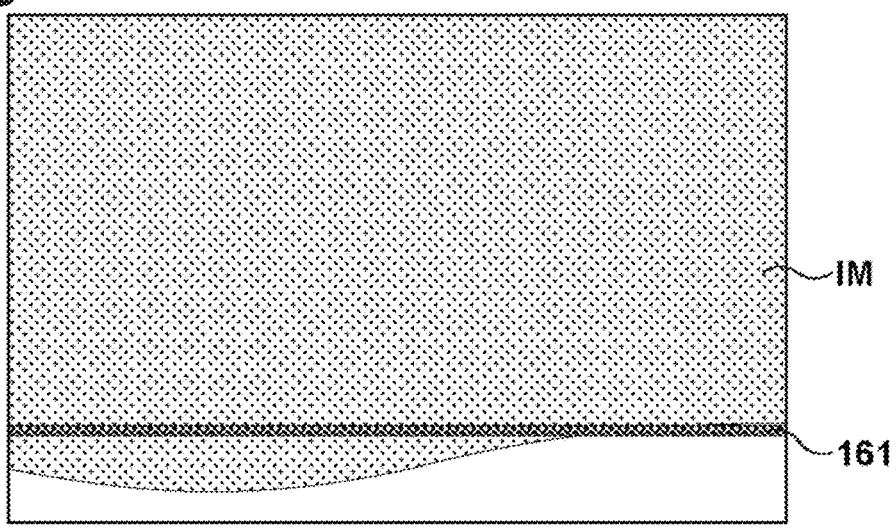

FIGS. 6A to 6C show examples of images to be captured in step S108 when extrusion and unfilling have occurred. Each of FIGS. 6A to 6C shows the image in a state in which the pattern of the imprint material IM has been formed in the shot region by the imprint process. In a normal state, as shown in FIG. 6A, the pattern is formed while the imprint material IM is filled up to a boundary 601 of the shot region. On the other hand, in a case of unfilling, as shown in FIG. 6B, the imprint material IM does not reach the boundary 601 of the shot region and an unfilled portion is captured as a white portion (or a black portion). In a case of extrusion, as shown in FIG. 6C, the imprint material IM protrudes from the boundary 601 of the shot region and the imprint material IM extending beyond the boundary 601 is captured as a black portion (or a white portion).

Figure 7:
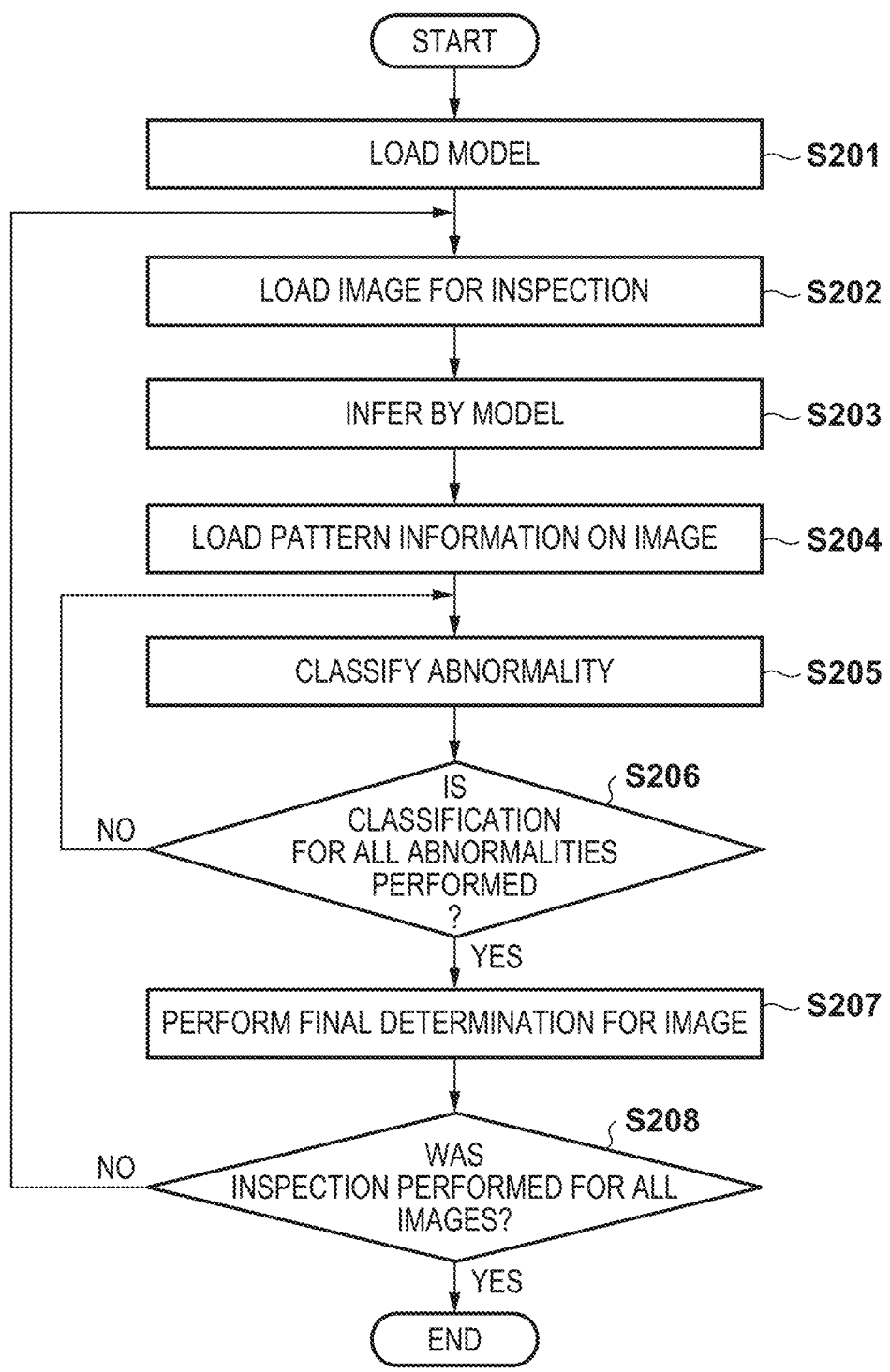
FIG. 7 is a flowchart of an evaluation method.

Next, with reference to the flowchart of FIG. 7, the image evaluation method executed by the evaluation apparatus 407 will be described. In the evaluation method, an abnormality (pattern formation defect) included in the image obtained in step S108 is detected, and the kind (extrusion/unfilling) of the abnormality is determined. A program for executing the evaluation method corresponding to the flowchart of FIG. 7 is stored in, for example, the storage apparatus 4074, and executed by the controller 4071 (processing device) after being loaded into the RAM 4072.

In step S201, the controller 4071 loads an inference model (which is a learned model, and to be also simply referred to as a "model") for inspection which outputs features of one or more abnormalities in the image. The inference model is a model created in advance based on the condition of a material (imprint material) as the inspection target, and an image obtained under the condition same as or similar to the measurement condition of the image obtained in step S108. The procedure for creating the inference model will be described later. In step S202, the controller 4071 loads the image obtained in step S108.

In step S203, the controller 4071 gives, as an input, the image obtained in step S202 to the inference model obtained in step S201 and obtains, as an output, features of one or more abnormalities on the image. The features of the abnormality are obtained for each abnormality on the image. The feature of the abnormality to be obtained can include at least one of the position of the abnormality in the image, the kind of the abnormality, the coordinates of vertices of a rectangle surrounding the abnormality, the likelihood of the detected abnormality, and the like. Here, the likelihood of the detected abnormality is a value indicating the probability and/or reliability of the detection of the abnormality, and is automatically calculated by the model for each detected abnormality. The king of the abnormality that can be detected includes extrusion in which the imprint material protrudes from the shot region and cured, and unfilling in which a region in the shot region is not fully filled with the imprint material. Other abnormalities can also be detected by letting the model learn them.

In step S204, the controller 4071 loads the device information (pattern information) on the image given as the input in step S203. The device information can include information such as the boundary position between the shot region as the inspection target and the adjacent shot region in the image, and the boundary position between the device region and the non-device region in the shot region. These boundary positions can be obtained from the coordinates with the center of the shot region upon capturing the input image as the origin, and the design information of the mold used in the imprint step.

In step S205, the controller 4071 determines, based on the features of the abnormality output from the model obtained in step S203, the kind of the abnormality (classifies the abnormality). In step S203, the kind of the abnormality is detected using the image information alone. On the other hand, in step S205, based on the position, size, and the like of the abnormality, it is comprehensively determined whether the image is a normal image or an image including an abnormality. Further, in step S205, even if the appearance of the abnormality is the same on the image, handling of the abnormality is changed depending on the position of the abnormality on the substrate S. Therefore, the abnormality detected in step S203 is further classified in step S205. At this time, the information loaded in step S204 may be used. In step S205, classification based on the size of the abnormality and classification using the pattern information loaded in step S204 and the position of the abnormality are performed.

A method of classifying the abnormality performed in step S205 will be described below.

Figure 10A:
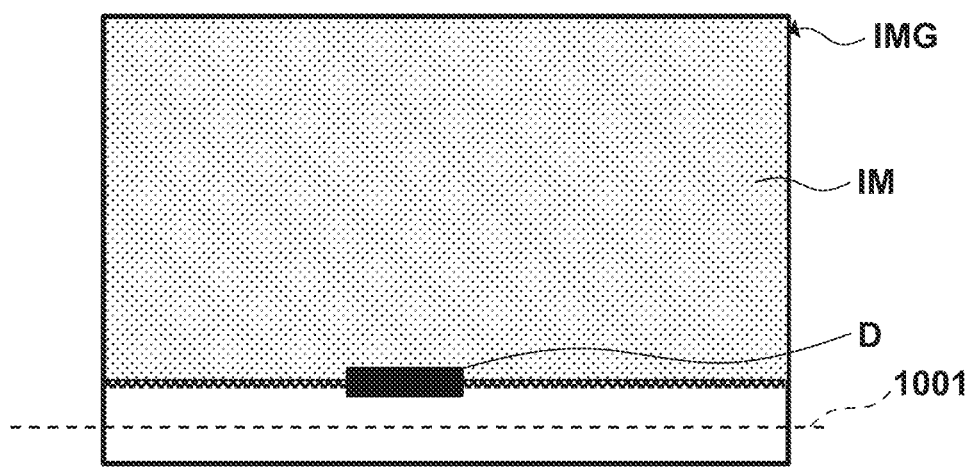
FIGS. 10A to 10C are views exemplarily showing classification of extrusion.
Figure 10B:
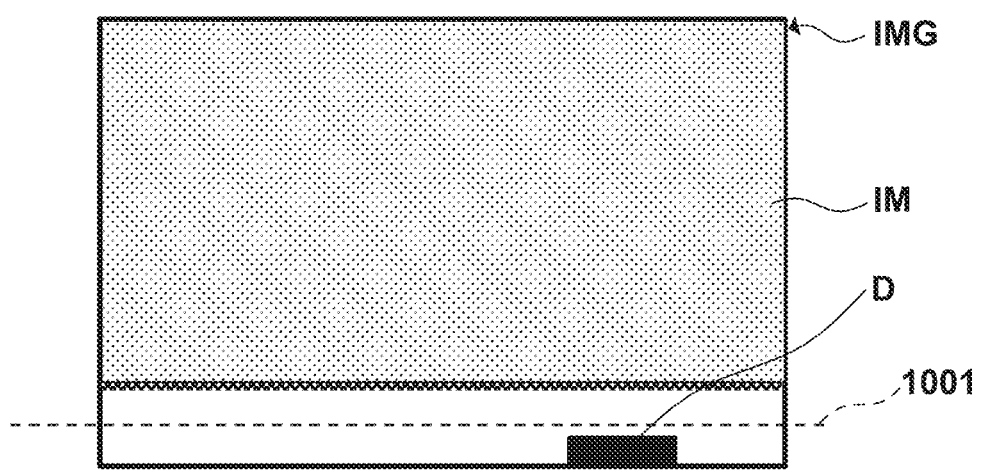
Figure 10C:
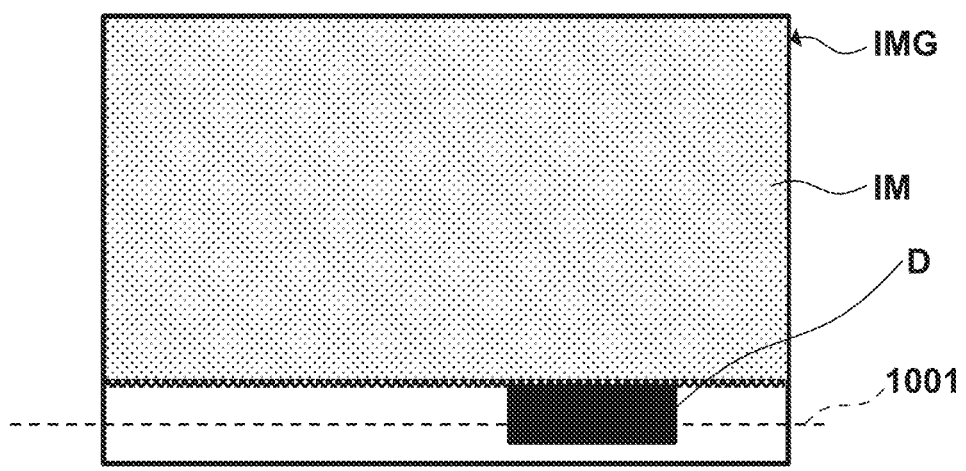

First, with reference to FIGS. 10A to 10C, an example of classification of extrusion will be described. The classification (determination) can be performed based on the relationship between the boundary of the shot region and the position and size of the abnormality. Each of FIGS. 10A to 10C shows an example of an image IMG of the shot region. The region shown in gray in each image is the region filled with the imprint material IM. A region D is the region of extrusion output as the abnormality from the model in step S203. There are various types of the regions D of extrusion. The region D of extrusion may appear as a black dot, or may appear differently depending on the measurement condition of the image and the characteristics of the material. A shot boundary 1001 is the boundary between the shot region as the inspection target and the adjacent shot region, and the position of the shot boundary 1001 is defined using the information loaded in step S204. Using these pieces of information, the category of abnormality can be subcategorized. In FIG. 10A, the region D of extrusion exists on the side of the shot region as the inspection target but does not extend beyond the shot boundary 1001. The extrusion in this case can be classified as small extrusion. In FIG. 10B, the region D of extrusion exists on the side of the adjacent shot region of the shot region as the inspection target. This extrusion is extrusion from the adjacent shot region, so that it can be classified as an abnormality which is not the detection target. In FIG. 10C, the region D of extrusion exists on the side of the shot region as the inspection target and extends beyond the shot boundary 1001. Such extrusion can be classified as large extrusion.

Next, a method for performing the determinations shown in FIGS. 10A to 10C will be described. For the determinations, the position, size, and kind of the abnormality detected by the model and the position of the shot boundary are used. The controller 4071 obtains the coordinates in the region D of the abnormality output from the model, and uses the coordinates as the position and size of the abnormality. The kind of the abnormality may also be obtained as the output from the model. The information of the shot boundary 1001 can be obtained from a predefined value, or may be obtained by calculation from the design information of the mold. The information of the shot boundary 1001 can be represented as a group of coordinates of the pixels at the positions serving as the boundary in the image. In FIGS. 10A to 10C, the group of coordinates of the pixels on the line of the shot boundary 1001 and the coordinates in the region D are used as the information for determining the position and size of the abnormality (extrusion).

In FIG. 10A, all the coordinates in the region D of the abnormality output from the model are not located beyond the coordinates of the shot boundary 1001, that is, they are the coordinates in the shot region as the inspection target, so that it is determined that the abnormality is a small abnormality. In FIG. 10B, all the coordinates in the region D of the abnormality output from the model are located beyond the coordinates of the shot boundary 1001, that is, they are the coordinates included in the adjacent shot region, so that it is determined that the abnormality is an abnormality in the adjacent shot region. In FIG. 10C, some of the coordinates in the region D of the abnormality output from the model are located beyond the coordinates of the shot boundary 1001, that is, a part of the region D is included in the adjacent shot region, so that it can be determined that the abnormality is large extrusion. At this time, it is also possible to set, in advance, a threshold for the size of extrusion, and classify the abnormality based on the longitudinal or lateral length thereof calculated from the coordinates in the region D.

Figure 11A:
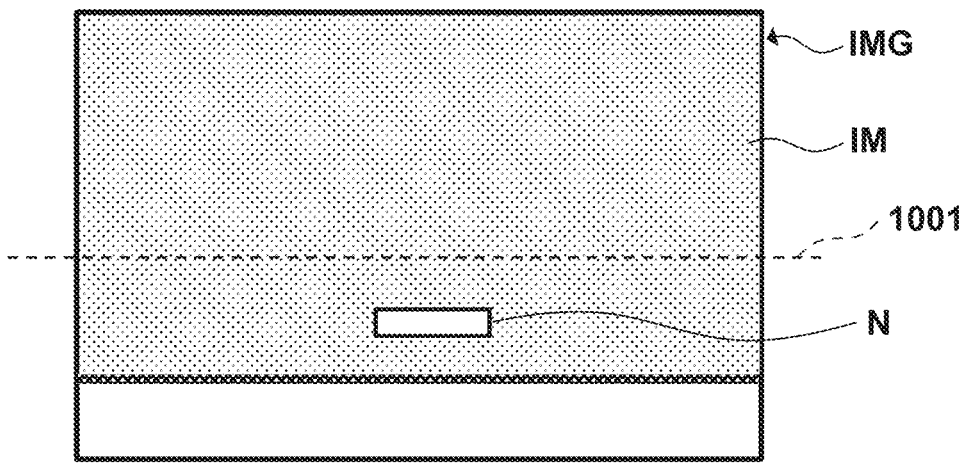
FIGS. 11A and 11B are views exemplarily showing classification of unfilling.
Figure 11B:
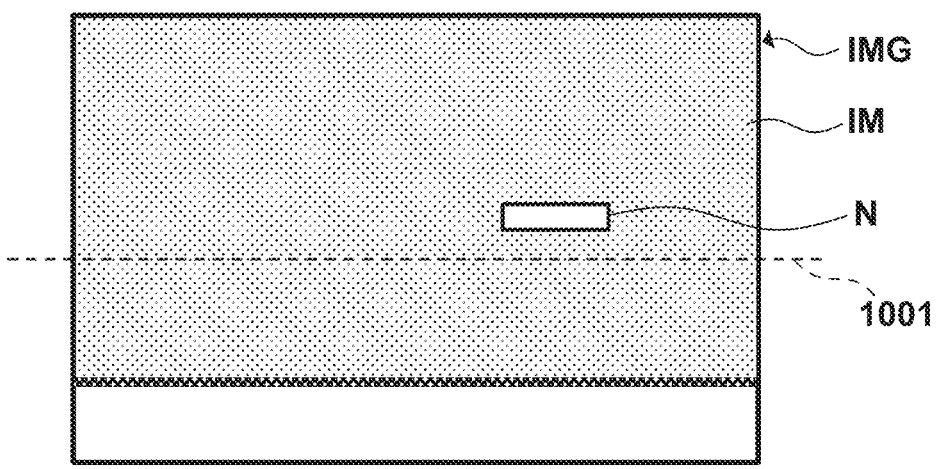

With reference to FIGS. 11A and 11B, an example of classification of unfilling will be described. The classification (determination) can be performed based on the relationship between the device boundary, which indicates the boundary between the device region and the non-device region in the shot region, and the position and size of the abnormality. Each of FIGS. 11A and 11B shows the image IMG of the shot region. The region shown in gray in each image is the region filled with the imprint material IM. A white region N is the unfilled region output as the abnormality from the model in step S203. A device boundary 1101 is the boundary between the device region and the non-device region in the shot region. The device boundary 1101 cannot be determined from the image information alone, so that it is defined from the information loaded in step S204. Using these pieces of information, the category of abnormality can be subcategorized. In FIG. 11A, the unfilled region N is in the non-device region located beyond the device boundary 1101, so that the region N can be classified as unfilling in the non-device region. In FIG. 11B, the unfilled region N is not located beyond the device boundary 1101 but exists in the device region, so that the region N can be classified as unfilling in the device region. The above-described references and categories for the classification are merely examples, and another classification based on combinations of other pieces of design information and conditions is also possible.

Next, a method for performing the determinations shown in FIGS. 11A and 11B will be described. For the determinations, the position, size, and kind of the abnormality detected by the model and the positions of the shot boundary and device boundary are used. The controller 4071 obtains the coordinates in the region N of the abnormality output from the model, and uses the coordinates as the position and size of the abnormality. The kind of the abnormality is also obtained as the output from the model. The information of the device boundary 1101 can be obtained from a predefined value, or may be obtained by calculation from the design information of the mold. The information of the device boundary 1101 can be represented as a group of coordinates of the pixels at the positions serving as the boundary in the image. In FIGS. 11A and 11B, the group of coordinates of the pixels on the line of the device boundary 1101 and the coordinates in the region N are used as the information for determining the position and size of the abnormality (unfilling).

In FIG. 11A, all the coordinates in the region N of the abnormality output from the model are located beyond the coordinates of the device boundary 1101, that is, they are on the side of the non-device region, so that it is determined that the abnormality is unfilling outside the device region. In FIG. 11B, all the coordinates in the region N of the abnormality output from the model are not located beyond the coordinates of the device boundary 1101, that is, they are on the side of the device region, so that it can be determined that the abnormality is unfilling on the device region.

Figure 12A:
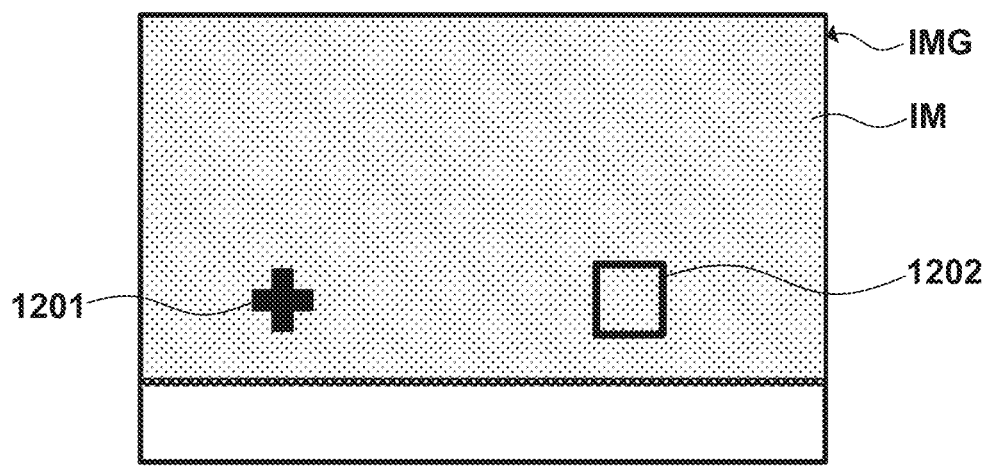
FIGS. 12A and 12B are views exemplarily showing classification of unfilling in marks.
Figure 12B:
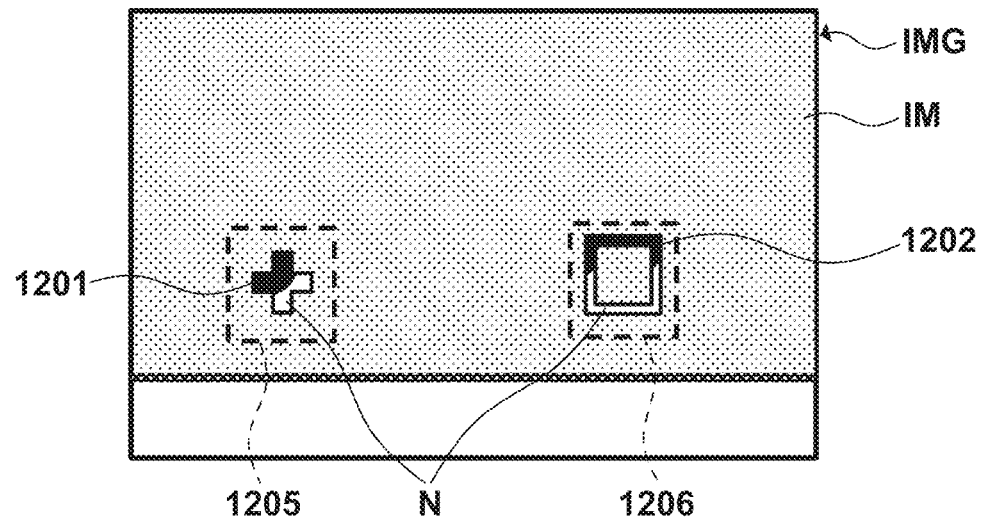

With reference to FIGS. 12A and 12B, an example of classification of unfilling occurring in a mark will be described. The classification (determination) can be performed based on the relationship between the position of the mark included in the shot region and the position and size of the abnormality. Each of FIGS. 12A and 12B shows the image IMG of the shot region. The region shown in gray in each image is the region filled with the imprint material IM. The shot region includes a first mark 1201 and a second mark 1202 having different shapes. In FIG. 12A, each of the first mark 1201 and the second mark 1202 is shown in black, so that each mark is in a normal state in which the imprint material IM is filled inside the mark. On the other hand, in FIG. 12B, a part of each of the first mark 1201 and the second mark 1202 is shown in white, so that each mark is in a state (unfilling) in which the imprint material IM is not sufficiently filled inside the mark. The region shown in white is unfilling N output as an abnormality by the model in step S203.

In FIG. 12B, each of reference numerals 1205 and 1206 indicates design information for each mark, which is one piece of the pattern information on the image loaded in step S204. Each of the pieces of design information 1205 and 1206 for each mark includes the information of the position and kind of the mark. In step S205, by combining the information as to the presence/absence of the unfilling N obtained in step S203 and the information of the position and kind of the mark obtained in step S204, the kind of the mark where the unfilling N has occurred can be classified. The above-described classification conditions and categories are merely examples, and they can be changed in accordance with the conditions including the material and design information of the inspection target, the apparatus data such as the light adjustment condition upon image capturing and the mode upon image capturing, and the like.

Next, a method for performing the determinations shown in FIGS. 12A and 12B will be described. For the determinations, the position, size, and kind of the abnormality detected by the model and the position of the mark on the image are used. The controller 4071 obtains the coordinates in the region N of the abnormality output from the model, and uses the coordinates as the position and size of the abnormality. The kind of the abnormality is also obtained as the output from the model. The information of the kind and position of the mark existing on the image can be obtained from a predefined value, or may be obtained by calculation from the design information of the mold. In practice, each of the design information 1205 and the design information 1206 is represented by a combination of the coordinates in the region N and the kind of the mark. In FIGS. 12A and 12B, if unfilling in each of the first mark 1201 and the second mark 1202 is detected by the model, the coordinates of a region surrounding the unfilled portion are obtained. By comparing the coordinates obtained here with the coordinates of the region of the mark, it can be determined whether the detected abnormality exists in the region of the mark.

For each of the detected abnormalities of various kinds, it is also possible to classify the abnormality based on comparison of the likelihood and a predetermined threshold. For example, when the likelihood is expressed by a value between 0 and 1, if the likelihood of the detected abnormality is lower than a predetermined threshold (for example, the threshold=0.5), the abnormality may be excluded from the target of final determination. The classification condition such as the threshold upon performing the classification based on the likelihood can be changed in accordance with the conditions including the material and design information of the inspection target, the apparatus data such as the light adjustment condition upon image capturing and the mode upon image capturing, and the like.

Referring back to the flowchart of FIG. 7, in step S206, the controller 4071 determines whether the classification has been performed for all the abnormalities on the image. If the classification for all the abnormalities on the image is not completed, the process returns to step S205, and the classification is performed for the next abnormality. If the classification for all the abnormalities on the image is completed, the process advances to step S207.

In step S207, the controller 4071 performs final determination for the image. For example, based on the condition of the material as the inspection target, the purpose, and the classification results of the respective abnormalities in the image in step S205, the controller 4071 determines the final determination value indicating whether the image is normal or abnormal. For example, assume a case in which final determination that the image is abnormal is made when the image includes a large abnormality. In this case, final determination that the image shown in FIG. 10A is normal is made since the region D of the abnormality does not exist beyond (crossing) the shot boundary 1001 from the side of the shot region. Final determination that the image shown in FIG. 10C is abnormal can be made since the region D of the abnormality exists beyond (crossing) the shot boundary 1001 from the side of the shot region. At this time, the size of the abnormal region can be distinguished using a distinguishing method based on the number of pixels in the abnormal region in the image. Alternatively, assume a case in which final determination that the image is abnormal is made when unfilling exists on the device region. In this case, final determination as to the abnormality can be made by comparing the position of the device region and the position of the abnormality. In this case, for example, final determination that the image shown in FIG. 11A is a normal image is made since the region N of the abnormality does not exist in the device region. Final determination that the image shown in FIG. 11B is an abnormal image is made since the region N of the abnormality exists in the device region. If there are a plurality of abnormalities on the image, the image may be classified to be normal/abnormal with the single abnormality as a reference based on a condition set in advance. Alternatively, if there are a plurality of abnormalities on the image, the determination for the image may be decided for each kind of the abnormality. When deciding the final determination value of the image, the final determination value may be decided based on the height, kind, likelihood, or the like of each of the various kinds of abnormalities existing in the image. The criteria for the determination based on the various kinds of classification results are not limited to the above-described examples.

Next, parameters used in determination, which a user can set, will be described. As the parameters used in abnormality determination, the user can set, for example, thresholds for the size and reliability of extrusion to be determined as an abnormality. FIG. 13 shows an example of a user interface (UI) screen DISP (setting device) section displayed on the display device 4076. The image IMG as the inspection target and a determination result 1303 for the image are displayed in the upper portion of the screen. The user can switch the image as the inspection target by performing an operation such as a press or tap of a feed button BTN via the input device 4075 serving as the user interface. They are not displayed if there is no image as the inspection target.

The user can set a value of the size of extrusion to be determined as an abnormality by using the input device 4075 to input the value to a text box 1302 or move a slider 1301. Further, the user can set a predetermined threshold for the likelihood to be determined as an abnormality by using the input device 4075 to input the value in a text box 1304 or move a slider 1305. At this time, the positions of the sliders 1301 and 1305 and the values displayed in the text boxes 1302 and 1304 can change in synchronization with each other, respectively. When the determination result 1303 is displayed, if the user changes any one of the parameters described above, the determination result 1303 can change in accordance with the changed parameter. Thus, according to this embodiment, a setting device and a display device serving as user interfaces are provided. The user can input a desired value to the setting device, and the image and the result of final determination are displayed in the display device. Accordingly, the user can set the parameter while checking the determination result. The user can set the above-described parameters in advance using the UI before performing abnormality inspection. By pressing or tapping an application button 1306, the user can apply the currently set parameter to the image data as the inspection target.

Figure 8:
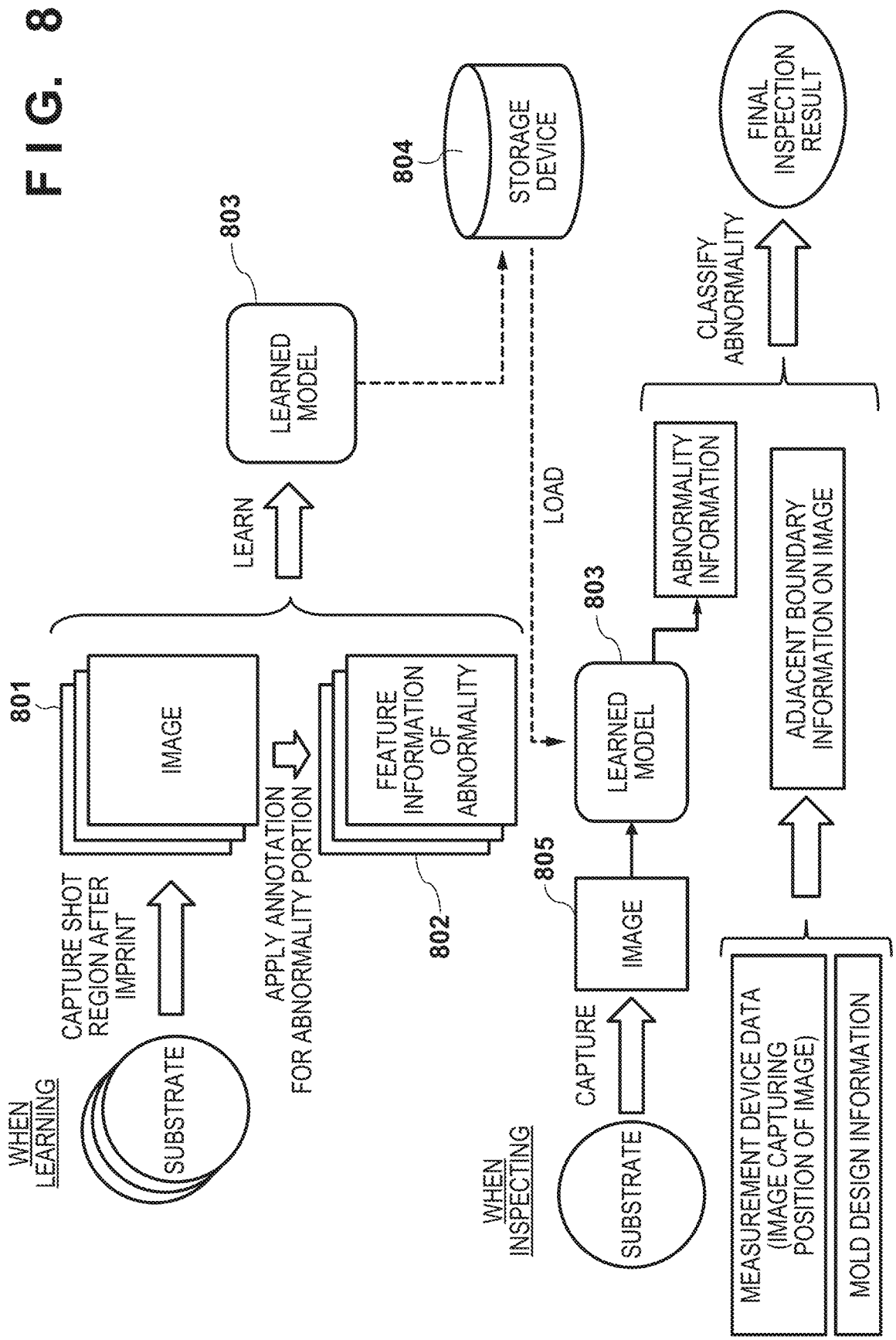
FIG. 8 is a schematic view showing a method executed upon learning and inspection.

Next, with reference to FIGS. 8 and 9, a method of calculating (learning), by the evaluation apparatus 407, the inference model (learned model) for abnormality detection will be described. FIG. 8 is a schematic view showing a method executed upon learning and inspection, and FIG. 9 is a flowchart for learning the abnormality detection. The evaluation apparatus 407 can include a machine learning device that generates the inference model by machine learning. The machine learning device performs machine learning while using, as an input to the inference model, an image including a composition formed on a substrate by forming processing and, as supervised data, the relationship between a plurality of images obtained in advance and feature information of respective abnormalities in the plurality of images. A specific example will be described below.

In step S301, the controller 4071 obtains a learning image 801 (for example, by image capturing) as in step S108. More specifically, based on the condition of the material and the measurement condition to be used when capturing an inspection image, the controller 4071 collects the image 801 similar to the inspection image. Further, the controller 4071 uses a plurality of substrates to collect the learning images 801 of a plurality of shot regions of the plurality of substrates. A larger number of images used for learning are preferable, and the image includes the sufficient number of samples of abnormalities as detection targets.

In step S302, feature information of the abnormality corresponding to each image obtained in step S301 is created. More specifically, after visually inspecting each of the obtained images, feature information 802 including information such as the category, size, and position of the abnormality is created for each of all the abnormalities existing in each images.

In step S303, the controller 4071 performs learning of the model based on the images obtained in step S301 and the feature information of the abnormalities created in step S302. Optimization is performed using the images 801 as input data to a neural network created in advance and the abnormality feature information 802 as the output (supervisor). Thus, a learned model (neural network) 803 is created.

In step S304, the controller 4071 stores the created learned model 803 in a storage device 804.

According to the embodiment described above, it is possible to automate abnormality detection in a shot region, and finer classification of abnormalities can be performed.

<Embodiment of Article Manufacturing Method>

An article manufacturing method according to an embodiment of the present invention is suitable for manufacturing an article such as a microdevice, for example a semiconductor device, or an element having a microstructure. The article manufacturing method according to this embodiment can include a step of forming a layer of a composition on a substrate by a forming apparatus in a forming system, and a step of processing the substrate on which the layer has been formed. The manufacturing method further includes other known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

The article manufacturing method will be described next. In step SA in FIG. 15, a substrate 1z such as a silicon substrate with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 15:
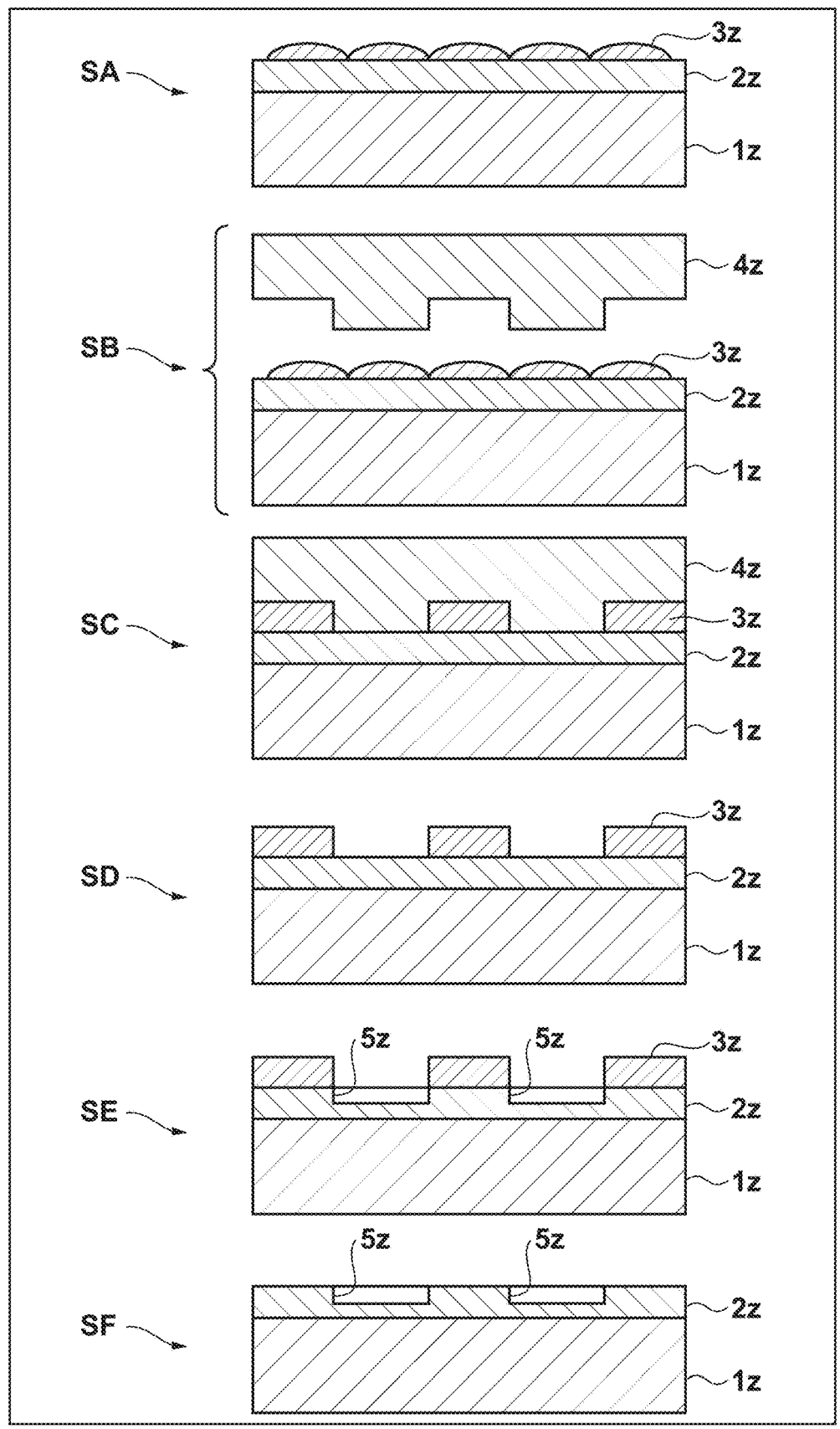
FIG. 15 is a view for explaining an article manufacturing method according to an embodiment.

In step SB in FIG. 15, a side of a mold 4z for imprint with a pattern having concave and convex portions is directed toward and made to face the imprint material 3z on the substrate. In step SC in FIG. 15, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

In step SE in FIG. 15, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the pattern having concave and convex portions of the mold 4z is transferred to the imprint material 3z.

In step SE in FIG. 15, when etching is performed using the pattern of the cured product as an etching resistant mask, a portion of the surface of the processed material 2z where the cured product does not exist or remains thin is removed to form a groove 5z. In step SF in FIG. 15, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as anon-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-055838, filed Mar. 29, 2021, which is hereby incorporated by reference herein in its entirety.

What is claimed is:

1. An evaluation apparatus that evaluates a composition formed on a substrate by forming processing, wherein the forming processing is processing of forming the composition by curing a formable material in a state in which the formable material on the substrate is in contact with a mold, the apparatus comprises:

an obtaining device configured to obtain an image including the composition formed on the substrate by the forming processing;

a processing device configured to process the obtained image for the evaluation by using an inference model; and a machine learning device configured to generate the inference model by machine learning, and the processing device is configured to:

output a feature of each of one or more abnormalities in the obtained image according to the inference model, obtain information regarding a formation region on the substrate where the composition has been formed, determine the kind of each of the abnormalities based on the output feature of each of the abnormalities and a relationship between the information regarding the formation region and a position and a size of the abnormality, and determine whether the image is a normal image or an image including an abnormality based on a result of the determination of the kind of the abnormalities, wherein the machine learning device performs machine learning while using, as an input to the inference model, the image including the composition formed on the substrate by the forming processing and, as supervised data, a relationship between a plurality of images obtained in advance and feature information of respective abnormalities in the plurality of images.

2. The apparatus according to claim 1, wherein the inference model calculates a likelihood representing a probability, a reliability, or both of a probability and a reliability of detection of the abnormality.

3. The apparatus according to claim 2, wherein the feature of the abnormality includes information of a position, a size, the kind, and the likelihood of the abnormality in the image.

4. The apparatus according to claim 3, wherein in a case where the likelihood is lower than a predetermined threshold, the processing device excludes the abnormality from a target of the final determination whether the image is the normal image or the image including the abnormality.

5. The apparatus according to claim 4, further comprising a setting device configured to set the size and the predetermined threshold in accordance with a value input via a user interface.

6. The apparatus according to claim 1, wherein the forming processing is an imprint process in which an imprint material as the formable material supplied onto a shot region on the substrate where a pattern is to be formed is brought into contact with a pattern portion of the mold to transfer a pattern of the mold to the imprint material, and the relationship includes a relationship between a boundary of the shot region and the position and the size of the abnormality.

7. The apparatus according to claim 6, wherein the kind of the abnormality includes extrusion of the imprint material, and in a case where a portion of the abnormality, among the one or more abnormalities, determined as the extrusion exists beyond the boundary of the shot region, it is determined that the image is an image including an abnormality.

8. The apparatus according to claim 1, wherein the forming processing is an imprint process in which an imprint material as the formable material supplied onto a shot region on the substrate where a device pattern is to be formed is brought into contact with a pattern portion of the mold to transfer a device pattern of the mold to the imprint material, and the relationship includes a relationship between a device boundary, which represents a boundary between a device region and a non-device region in the shot region, and the position and the size of the abnormality.

9. The apparatus according to claim 8, wherein the kind of the abnormality includes unfilling of the imprint material, and in a case where the abnormality, among the one or more abnormalities, determined to be the unfilling exists in the device region, it is determined that the image is an image including an abnormality.

10. The apparatus according to claim 1, wherein the forming processing is an imprint process in which an imprint material as the formable material supplied onto a shot region on the substrate where a pattern is to be formed is brought into contact with a pattern portion of the mold to transfer a pattern of the mold to the imprint material, and the relationship includes a relationship between a position of a mark included in the shot region and the position and the size of the abnormality.

11. The apparatus according to claim 1, further comprising a controller configured to display, on a display device, the image and a result of the final determination whether the image is the normal image or the image including the abnormality.

12. A forming system including:

a forming apparatus configured to perform forming processing of forming a composition made of a cured product of a formable material on a substrate by bringing the formable material on the substrate into contact with a mold and curing the formable material; and an evaluation apparatus defined in claim 1.

13. An article manufacturing apparatus comprising:

forming a layer of a composition on a substrate by a forming apparatus in a forming system defined in claim 12; and processing the substrate on which the layer has been formed, wherein an article is manufactured from the substrate having undergone the processing.

14. An evaluation method of evaluating a composition formed on a substrate by forming processing, wherein the forming processing is processing of forming the composition by curing a formable material in a state in which the formable material on the substrate is in contact with a mold, and the method comprises:

obtaining an image including the composition formed on the substrate by the forming processing;

outputting a feature of each of one or more abnormalities in the obtained image according to an inference model;

obtaining information regarding a formation region on the substrate where the composition has been formed;

determining the kind of each of the abnormalities based on the output feature of each of the abnormalities and a relationship between the information regarding the formation region and a position and a size of the abnormality;

determining whether the image is a normal image or an image including an abnormality based on a result of the determination of the kind of the abnormalities; and learning while using, as an input to the inference model, the image including the composition formed on the substrate by the forming processing and, as supervised data, a relationship between a plurality of images obtained in advance and feature information of respective abnormalities in the plurality of images.

15. A non-transitory computer-readable storage medium storing a program for causing a computer to perform respective steps of an evaluation method of evaluating a composition formed on a substrate by forming processing, wherein the forming processing is processing of forming the composition by curing a formable material in a state in which the formable material on the substrate is in contact with a mold, and the method comprises:

obtaining an image including the composition formed on the substrate by the forming processing;

outputting a feature of each of one or more abnormalities in the obtained image according to an inference model;

obtaining information regarding a formation region on the substrate where the composition has been formed;

determining the kind of each of the abnormalities based on the output feature of each of the abnormalities and a relationship between the information regarding the formation region and a position and a size of the abnormality;

determining whether the image is a normal image or an image including an abnormality based on a result of the determination of the kind of the abnormalities; and learning while using, as an input to the inference model, the image including the composition formed on the substrate by the forming processing and, as supervised data, a relationship between a plurality of images obtained in advance and feature information of respective abnormalities in the plurality of images.

* * * * *